(12) United States Patent
Wojcik

(10) Patent No.: US 6,525,657 B1
(45) Date of Patent: Feb. 25, 2003

(54) APPARATUS AND METHOD FOR PRODUCTION TESTING OF THE RF PERFORMANCE OF WIRELESS COMMUNICATIONS DEVICES

(75) Inventor: Jacek J. Wojcik, Nepean (CA)

(73) Assignee: Aprel, Inc., Nepean (CA)

( * ) Notice: Subject to any disclaimer, the term of this patent is extended or adjusted under 35 U.S.C. 154(b) by 0 days.

(21) Appl. No.: 09/557,369

(22) Filed: Apr. 25, 2000

(51) Int. Cl.$^7$ .............................................. G08B 29/00
(52) U.S. Cl. ...................... 340/514; 340/515; 455/67.1; 455/67.2; 455/115; 455/423; 324/750; 324/759; 324/612
(58) Field of Search ................................. 340/514, 515; 324/750, 759, 612, 627, 637, 639, 636; 174/35; 455/423, 425, 67.2, 115, 67.1, 67.4

(56) References Cited

U.S. PATENT DOCUMENTS

| | | | | |
|---|---|---|---|---|
| 4,813,789 A | * | 3/1989 | Olsen ........................ | 324/105 |
| 5,430,456 A | * | 7/1995 | Osburn et al. ............... | 343/703 |
| 5,530,412 A | * | 6/1996 | Goldblum ................... | 455/67.2 |
| 5,585,808 A | * | 12/1996 | Wysome ...................... | 343/703 |
| 5,723,975 A | * | 3/1998 | Rogers ....................... | 324/72.5 |
| 5,825,331 A | * | 10/1998 | Lee ........................... | 455/67.2 |

OTHER PUBLICATIONS

"SAR Measurements Requirements SSI/DRB–TP–D01–030", Spectrum Sciences Institute RF Dosimetry Research Board and Aprel Laboratories (Mar., 1998), provided at www.Aprel.com.

"Phantom Design Requirements SSI/DRB–TP–D01–031", Spectrum Sciences Institute RF Dosimetry Research Board and Aprel Laboratories (Mar., 1998), provided at www.Aprel.com.

"Probe Design an Calibration Requirements SSI/DRB–TP–D01–032", Spectrum Sciences Institute RF Dosimetry Research Board and Aprel Laboratories (Mar., 1998), provided at www.Aprel.com.

"Tissue Recipe and Calibration Requirements SSI/DRB–TP–D01–033", Spectrum Sciences Institute RF Dosimetry Research Board and Aprel Laboratories (Mar., 1998), provided at www.Aprel.com.

"Positioning and Scanning Requirements SSI/DRB–TP–D01–034", Spectrum Sciences Institute RF Dosimetry Research Board and Aprel Laboratories (Mar., 1998), provided at www.Aprel.com.

"Uncertainty Assessment Requirements SSI/DRB–TP–D01–035", Spectrum Sciences Institute RF Dosimetry Research Board and Aprel Laboratories (Mar., 1998),provided at www.Aprel.com.

\* cited by examiner

Primary Examiner—Donnie L. Crosland
(74) Attorney, Agent, or Firm—Woodcock Washburn LLP

(57) ABSTRACT

A radio frequency (RF) multi-testing apparatus and method for rapid (e.g. production line) testing of a wireless communications device for operational adherence of the device to a pre-determined reference specification defining specific absorption rate (SAR) parameters correlated to the device and for simultaneous testing of the body loss of the device. The device is positioned within an RF shielded enclosure and operated at a test transmit power. A linear array of E-field isotropic probes (e.g. five) are positioned at a predetermined location in the container within human tissue simulation matter and measure the electric-field therein. A plurality of RF isotropic probes are spatially distributed within the container and measure the RF power received thereby, with the container providing reflective surfaces therein. Computer processing apparatus compares the electric-field measurements to the SAR reference specification and determines therefrom whether the device adheres to the specification. The computer processing apparatus also combines the RF power measurements and produces a value representing the averaged integrated body loss of the device. The determination of whether the device adheres to the SAR specification also determines a measure of the metallic system integrity of the device.

23 Claims, 8 Drawing Sheets

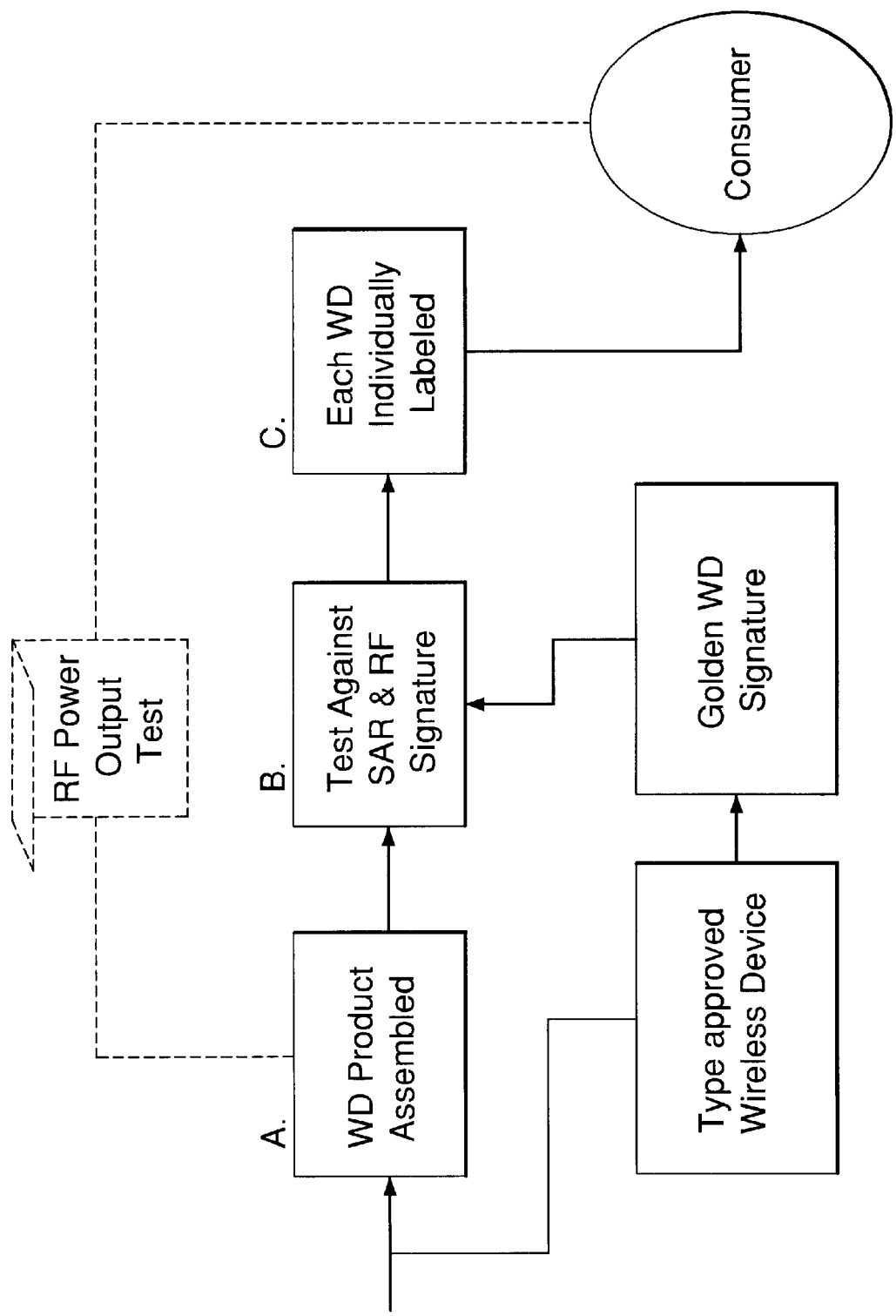

a) Signature for DUT 2D b) Signature for DUT 3D c) Placement of Golden device for signature testing d) Probe array measurement reading at various distances

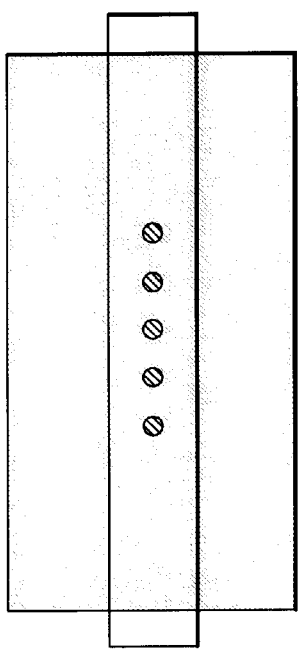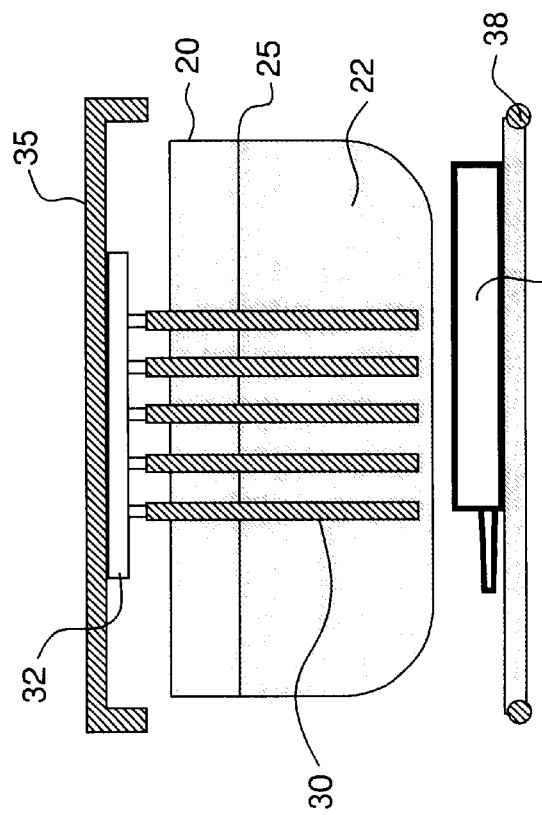

SARTECH V2.0-[QL-ILT]

Statistics | Current Results | Reference

International Compliance
Licensed No. 135-ADD-27
Licensed to: Cellar 2 MFG
Auditor: ADCD Int ○ ERP [0.563 W] ○ ○
AIBL [6.53 dB] ○ ○
SAR [0.75 W/kg] ○ ○
MSI [0.81%] ○ ○

○ ERP [E-pto 12345]
AIBL [A-pto 12345]
SAR [S-pto 12345]
MSI [M-pto 12345]

Model number
[PTO cell]
Period start
[21-12 99]
Period end
[26-12-99]
S/N start
[87654-99]
S/N end
[98654-99]
Units passed
[10036]
Units failed
[25]
(Since Jan 26,2000)

Details

New Reference

Complete RF performance test
S/N: [PTO-0987654-99]

PASS  FAIL

Last Calibration date:
[23-11-1999]

Test Triggers
○ Automatic  ● Manual

Tester maintained and calibrated by
APREL
*Labratories*

Start Test

*Proprietary and Confidential Material of APREL Labratories*

Start | 2000-03-15 | 6:56 PM

FIG. 7

APPARATUS AND METHOD FOR PRODUCTION TESTING OF THE RF PERFORMANCE OF WIRELESS COMMUNICATIONS DEVICES

FIELD OF THE INVENTION

This invention relates generally to the field of radio frequency radiation testing for wireless communications devices and, more particularly, to a testing apparatus and method suitable for high speed testing and analysis of RF performance of wireless devices during mass production thereof.

BACKGROUND OF THE INVENTION

Numerous types of wireless communications devices are if being used for various purposes and the number of such devices being developed and produced for public use is growing rapidly worldwide. These devices operate over a wide range of radio frequencies and output power levels. The cellular telephone devices which are now common, for example, operate in the 800 or 900 MHz range and at power levels of about 600 mW while blue tooth devices operate in the 2.4 GHz range at significantly lower power levels. For most such devices, and particularly in the case of cellular telephones, there are technical standards (e.g. the Federal Communications Commission (FCC) in the U.S.A. or the Radio Standards Specifications (RSS) of the department of Industry Canada of the Canadian Government) and safety regulations (e.g. the Safety Code of Health Canada, a department of the Canadian government) which must be complied with by the manufacturers and carriers thereof in order to obtain government approval and avoid sanctions. Increasingly, these standards are providing narrower windows of acceptable performance levels which must be met by manufacturers, the reason being that more and more of the frequency spectrum is being carved up and allocated for wireless applications and an increasing number of geographic cells are being allocated for wireless communications. Consequently, a trend is underway whereby reduced power levels are being mandated for such devices. It is, therefore, becoming increasingly important to the usefulness of such devices that they utilize the full power level permitted to them in order to achieve their designated geographical coverage. This trend poses a challenge to the manufacturers of wireless devices to reduce their manufacturing tolerances for the operational power output levels of these devices so that for any given device one may be certain that, in operation, it will not exceed the maximum permitted power levels but will also not fall significantly below such maximum.

In addition to regulations imposing a more rigorous budgeting of power for purposes of allocating limited frequency resources, there is also a growing climate of concern for the health and safety issues relating to RF transmissions and the associated human radiation absorption levels. Regulatory standards, such as the Canadian Health Code, now exist to limit such absorption levels and these are referred to as SAR (Specific Absorption Rate) limitations. Many publications directed to SAR testing exist in the art and, as examples of these, reference is made to Health Canada Safety Code SC6 and the various reports and conference papers which are available through the Internet at the Website www.aprel.com of Aprel Laboratories of Nepean, Canada.

The purpose of SAR testing is to measure the electric field inside of simulated human tissue (i.e. simulated head and hand or body tissue) to determine the amount of RF energy which the tissue is absorbing when exposed to radiation from an RF source. SAR is calculated from the E-field ($E^2$) measured in a volume grid of test points within the tissue and is expressed as RF power per kilogram of mass, averaged in 1 cubic centimeter (or 1 gram) of tissue for head tissue or 10 cubic centimeters (or 10 grams) for hand or body tissue. A human-like manikin or Unihead "phantom" container is used to hold a tissue simulation solution designed to simulate head tissue and a similar solution is used to simulate hand or body tissue. The wireless device under test (DUT), for example a cell phone, is positioned close to the phantom (usually directly below the reference center of the container) and an isotropic E-field probe (a dipole probe) is successively, precisely located within the tissue simulation solution, over a stepped series of positions covering the volume of the solution, by means of a robotic probe positioner. The complete SAR testing is, of course, completed in an electromagnetic controlled environment. The stepped re-positioning of the probe is done very slowly because the tissue simulating solution must be uniformly still and stable for all of the position tests in order to achieve useful results. Typically the E-field measurements are taken over a grid comprising a total of over 100 target test positions during standardized SAR testing. Therefore, the time required to complete such SAR testing is typically hours and such lengthy tests are unsuitable for production line testing.

However, the developed SAR testing standards are not uniform around the world and much debate exists over various aspects of the testing tools and methodology used to measure SAR performance. Moreover, because the objective of such standardized testing methodologies is to produce absolute measurements the test procedures which have to date been developed are complex, lengthy and laboratory-based. Consequently, the existing standardized tests are useful only for generic approval testing of specimens and cannot be used within the manufacturing process itself to test individual production units. There is, however, a strong need for a means of fast and effective production testing to ensure not only the compliance of production units with regulatory standards but to ensure also that specification tolerance limits (which may be specific to particular carriers) are met by those units.

SUMMARY OF THE INVENTION

In accordance with one embodiment of the invention there is provided a radio frequency (RF) testing apparatus for rapid testing of a-wireless communications device for operational adherence of the device to a pre-determined reference specification defining specific absorption rate (SAR) parameters correlated to the device. The device is positioned within an RF shielded enclosure (chamber) and is operated at a test transmit power during the testing. A plurality of means for measuring electric-field (e.g. isotropic E-field probes) are position at a pre-determined location within human tissue simulation matter and take measurements of an electricfield at the location which are transmitted to receiving means. The measurements are compared (preferably by computer processing means) to the SAR reference specification and a determination is made whether the device adheres to the specification. Preferably, this also determines a measure of the metallic system integrity of the device. Preferably, a linear array of uniformly spaced E-field probes are provided.

The enclosure is of a sufficiently small size to permit the apparatus to be incorporated into a production line for manufacturing wireless communication devices and has reflective surfaces therein.

Also in accordance with the invention there is provided a radio frequency (RF) testing apparatus for rapid testing of the body loss of a wireless communication device positioned within an RF shielded enclosure having reflective surfaces therein and operating at a test transmit power during the testing. A plurality of RF power measuring means (e.g. isotropic probes) are spatially distributed within the enclosure and take measurements of the RF power received thereby. Those measurements are combined, preferably by computer processing means, and a value representing the averaged integrated body loss of the device is produced. One of the RF power measuring probes is preferably located within A the enclosure at a hot spot for the RF power for producing signal value representing the operating effective radiated power for the wireless communications device.

In a preferred embodiment of the invention (RF) multi-testing apparatus is provided according to the foregoing for rapid simultaneous testing of the body loss of a wireless communication device and operational adherence of the device to a pre-determined reference specification defining specific absorption rate (SAR) parameters correlated to the device.

Also in accordance with the invention there is provided a method for rapid radio frequency (RF) testing of a wireless communications device in a production line environment for the manufacture of the device.

DESCRIPTION OF THE DRAWINGS

The present invention is described in detail below with reference to the following drawings in which like reference numerals refer throughout to like elements.

FIG. 1 is a block diagram of a general overview of the production testing method of the invention and, for comparative purposes, shows in dotted lines the prior art "quiet box" power output test which is sometimes carried out in the prior art;

FIG. 4(a) is a plan view of the probe array of the testing apparatus in position within the tissue simulator (the "phantom") and showing the device under test (DUT) in position for testing and FIG. 4(b) is a top view thereof;

DETAILED DESCRIPTION OF A PREFERRED EMBODIMENT

Figure 2A:
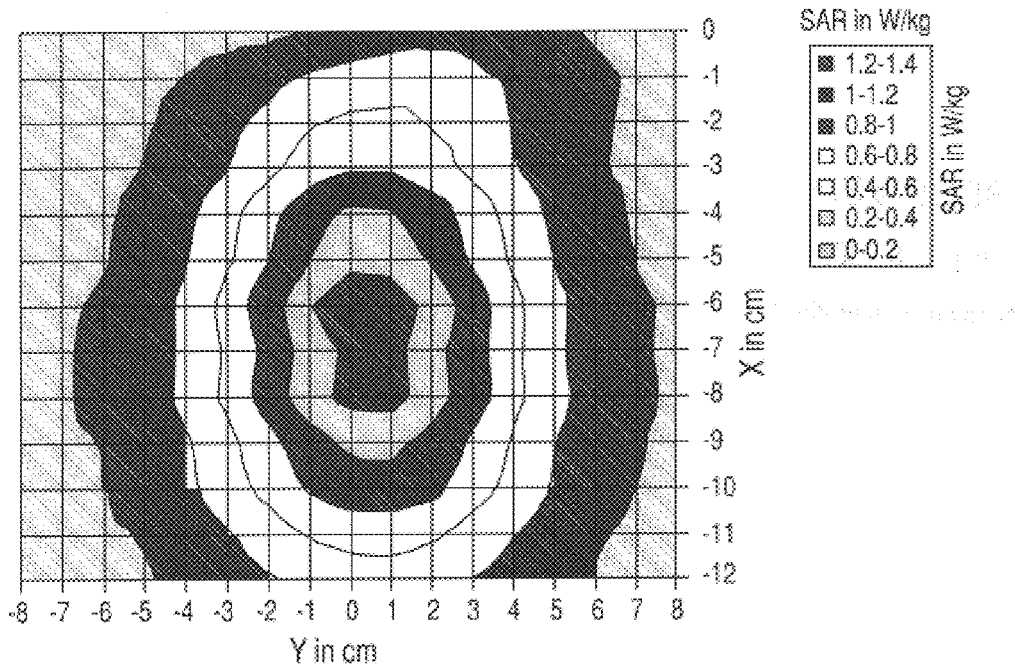
FIGS. 2(a), (b) and (d) depict test data for an SAR Signature mapping for a chosen representative ("golden") device for a given Device Under Test (DUT)

The inventor has developed a simplified method of SAR and AIBL testing for wireless devices which is fast and effective for usage in the mass production of such devices and can be combined with other types of wireless device tests, done simultaneously, to produce a per unit test/pass result, per unit SAR/MSI/AIBL/OERP measurements and statistical analyses based on selected production periods or unit numbers.

This development follows the discovery of the inventor that a relatively small number of different probe position E-field measurements can be used to determine whether the SAR mapping for the particular DUT will match a reference mapping for that type of device. Further, there was a realization by the inventor that the complexities of the known standardized test methods which derive from the absolute nature of those tests may, advantageously, be avoided by using a fixed reference SAR mapping produced for each particular type of product to be tested and based on an appropriate representative device of the type to be tested.

Specifically, the inventor has found that for any given product design a reference "SAR Signature" map for that product can be produced using a "golden" sample device (i.e. a non-production sample device which is known to have no production defects and whose radiation performance meets all desired design specifications) as the device under test (DUT) The resultant Signature mapping is then used as a reference against which other unit devices of that type are tested during the mass production of those units. By using this reference-based means of evaluating the DUT the inventor has found that, instead of requiring SAR testing at numerous positions throughout the volume of the phantom solution it is sufficient to test a linear set of spaced positions at a selected and uniform depth of the solution. Moreover, because such linear testing can be done simultaneously by an array of probes, a minimal disturbance to the solution is created and the complete testing can be achieved within a few seconds.

Further, by achieving the use a reference SAR Signature map to test wireless devices during their production the inventor has advantageously eliminated numerous problems associated with the known standardized test methods. One such advantage is that the integrity of the phantom becomes less critical (e.g. uniformity of the composition) or relatively unimportant (e.g. phantom configuration). Since the inventor's test method seeks relative and not absolute test results it is, within reasonable limits, immaterial to those test results whether the phantom specifications are true.

In addition, the inventor has discovered that the foregoing SAR test results correlate directly to the metallic system integrity for the device under test (DUT) and can be used effectively to identify production devices which are defective due to assembly errors in wiring, loose materials or other default conditions affecting the RF aspect of the electronic design. Such default conditions cause the radiation characteristics of the device to change because at the high frequency level of the transmitted signals of the DUT the radiation emanates not simply from the antenna provided on such device but, rather, from the metallic components of the device as a whole. Therefore, a substantial change in the metallic integrity of the device will cause a corresponding deviation in the SAR test results and a device showing SAR levels below a pre-determined minimum level can thereby be identified as a production failure (and the device discarded). Accordingly, the SAR testing identifies not only those faulty units which exceed the regulatory SAR limitations but also those which are shown to have an assembly defect when they fall below pre-determined minimum SAR levels.

A general overview of the testing method of the invention is shown in solid line in FIG. 1. In FIG. 1 the prior art production line "quiet box" is shown in dotted line, the "quiet box" being a simple shielded box in which a single probe simply measures the RF power output of the wireless device to detect any major output power defect that may have occurred. As shown by FIG. 1, the wireless device (WD) is assembled at point A in the production line. That same device (now referred to as the device under test) is tested at point B for SAR, MSI, AIBL and OERP using computer processing to process RF radiation data obtained in accordance with the invention and a pre-determined reference specification defining specific absorption rate (SAR) parameters correlated to the device under test (DUT) (that is by referring to data defining a SAR Signature map of a golden device for that DUT) If the device passes the testing (i.e. if it matches the Signature mapping within a pre-determined tolerance) it is then labeled with a unique test number at point C and the test results are stored for later usage in statistical analyses and for record keeping purposes with respect to that particular device. During the testing of the DUT it is set to its full transmit power setting (many wireless devices provide this setting as a manually selectable option but some must be programmed to provide this test setting). Accordingly, while being tested the device is operated at a test transmit power.

Figure 2B:
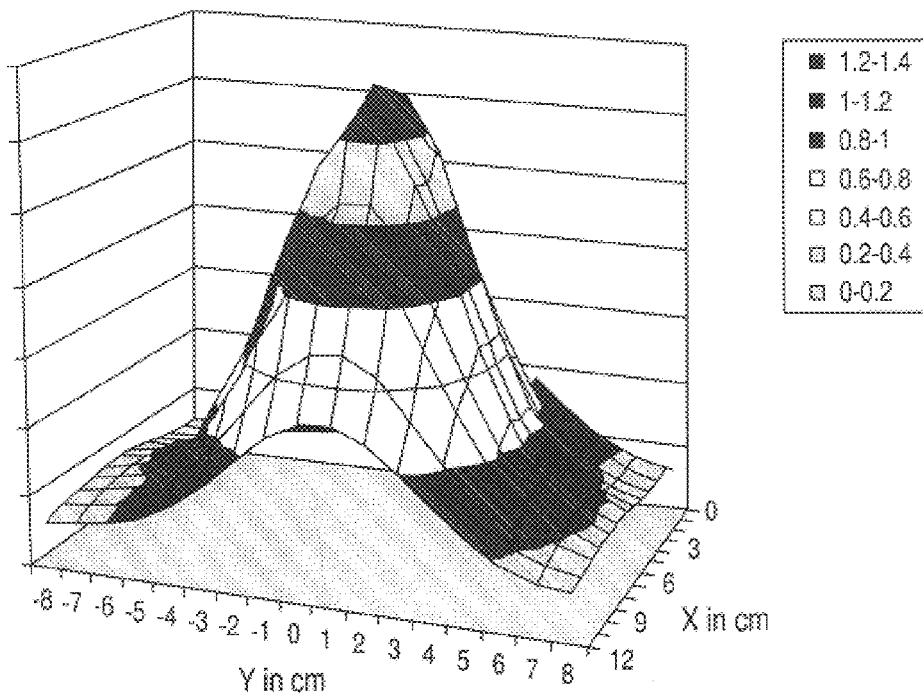
FIG. 2(c) illustrates a representative placement of the DUT relative to the phantom during Signature testing.
Figure 2C:
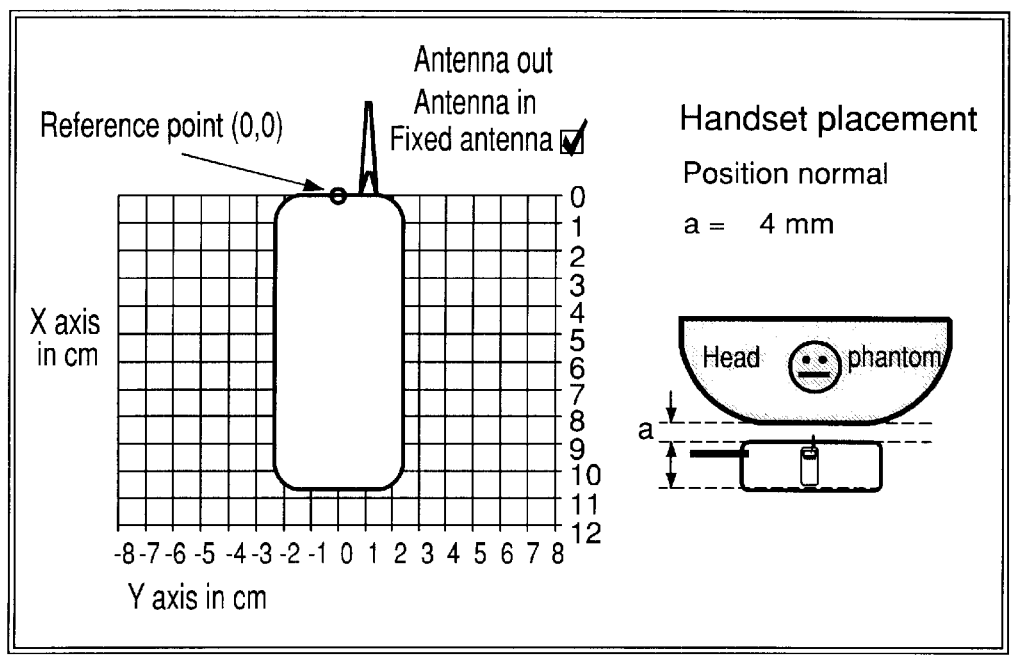
Figure 2D:
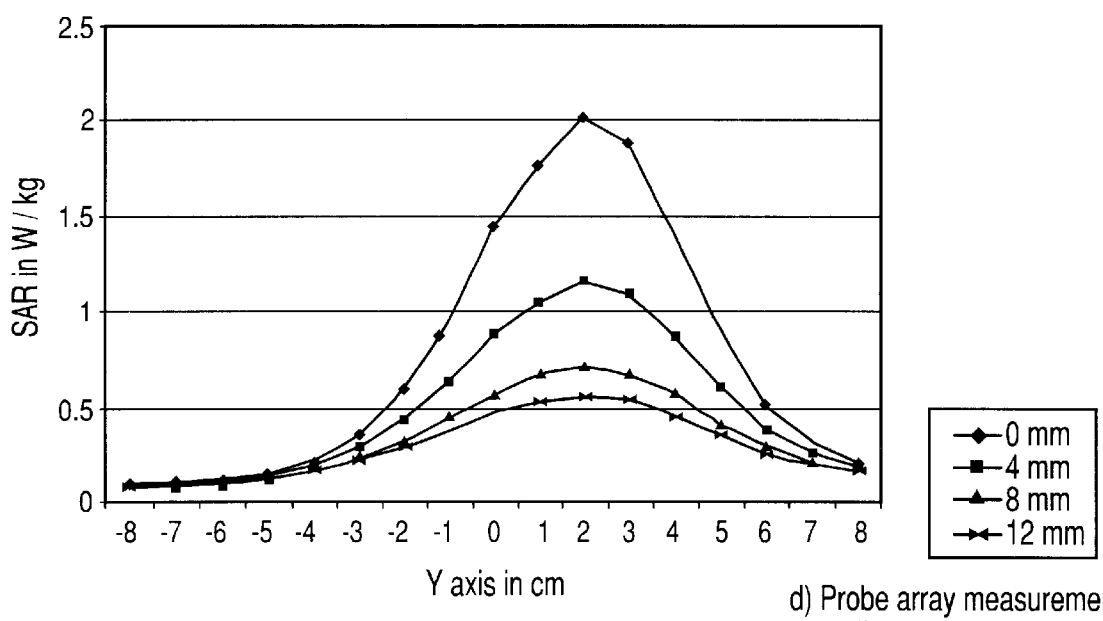

FIGS. 2(a)–(d) depict sample test data/conditions for the SAR Signature mapping for a chosen representative ("golden") device for the DUT. FIG. 2(a) shows a two dimensional graphical depiction of the SAR Signature mapping and FIG. 2(b) shows the same Signature but as a three dimensional diagram. FIG. 2(c) shows the placement of the golden device relative to the phantom for the signature testing of the golden device which resulted in the production of the sample Signature map. FIG. 2(d) is a graph showing SAR readings for the Signature testing taken at the stated Y-axis positions over a fixed X-axis position (selected to be the X-axis position having the highest relative reading, referred to in the trade as the "hot spot"), the four graph lines representing the test readings obtained for four different distances "a" of the DUT from the phantom (i.e. 0 mm, 4 mm, 8 mm and 12 mm).

As shown in the example drawings of FIG. 2, the illustrated sample Signature map is made up of SAR values measured for a golden device over a horizontal grid of 16×12. This specific grid, chosen for a particular DUT, is illustrative of one grid example only, however, and the appropriate grid size to be selected in any give application will depend upon the type of device to be tested. For example, in the case of some types of wireless devices their configuration will render suitable a much narrower grid size. For the signature testing the probe is positioned at a vertical distance of between a few millimeters and and a few centimeters from the bottom of the phantom, the objective being to closely position the probe in the phantom relative to the DUT where the power levels are the highest while still leaving a sufficient depth of the tissue simulation material surrounding the probe to obtain satisfactory SAR readings. The inventor has found that SAR testing at a vertical distance within this range will result in an SAR Signature map which can be compared to the test results of a DUT using fewer SAR test positions (e.g. five positions spaced horizontally along the Y-axis shown in FIG. 3 (b)) to reliably determine whether the DUT matches or does not match the Signature map.

Figures 3A, 3B:
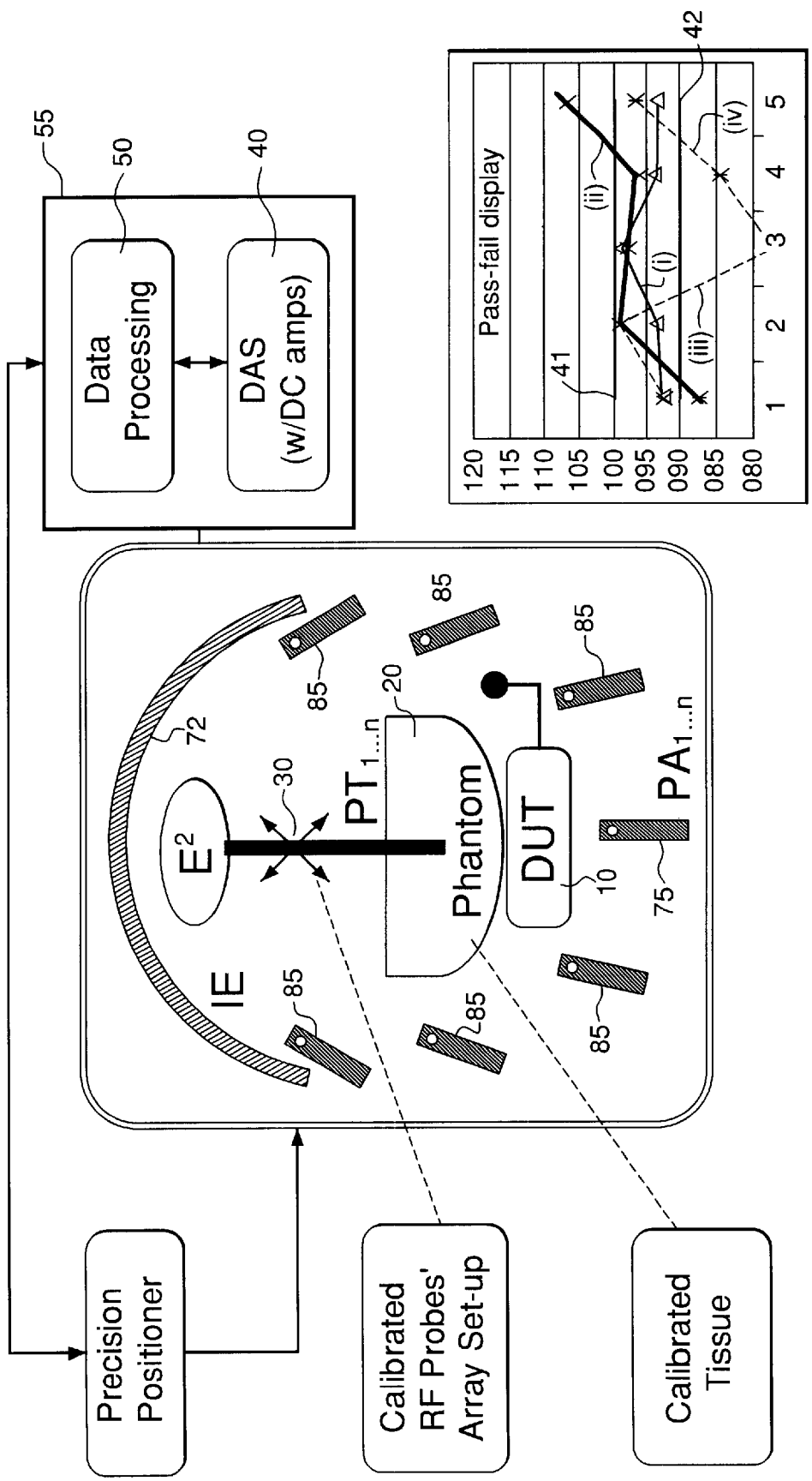
FIG. 3(a) is an operational block diagram showing a wireless communications device under test (DUT) in accordance with invention and FIG. 3(b) shows a graphic display of sample SAR/MSI test results for four different tested devices (i)–(iv)

FIG. 3 shows a DUT 10 in position below a phantom 20 (being an open container, as illustrated, comprised of a ok dielectric material and containing an appropriate tissue simulation solution therein which is calibrated to simulate human head or hand or body tissue) in which a linear array of RF probes 30 (better shown in FIG. 4)chosen to be five in number for the preferred embodiment, is positioned so that the center probe is located at the maximum SAR level for the reference Signature map (which is illustrated by FIG. 2 (b)) The measurements of the probes (diodes) are input to a data acquisition system (DAS) 40, which may include DC amplifiers if needed and which converts the diode DC signal values into E-field values (using the relationship that the DC values are proportional to the square of the E-field). The probe data is then compared, by a computer processor 50, to the Signature (reference) map and the processor determines whether the SAR test results of the DUT match the Signature, in which case the device is identified as having passed the test, or whether it exceeds the Signature, in which case the device is identified as having failed the test. For illustrative purposes, FIG. 3(b) is provided to show that a device which passes the SAR test may not pass the MSI test. By the graphs (i)–(iv) of FIG. 3(b) it is shown that the DUT (i) matches the Signature closely as all measurements of the probes (1–5) are within the maximum (1.00) and minimum (0.90) of the relative (i.e. normalized) SAR levels determined for that particular Signature as per an appropriate set of readings according to FIG. 2(d) (the maximum SAR level being shown by the straight line 41 and the minimum SAR level, determined on the basis of the device specifications, being shown by straight line 42). However, the DUT (ii) fails both the SAR test and MSI test because its test readings fall both above the maximum normalized SAR level 41 and below the minimum normalized SAR level 42. Each of the DUTs (iii) and (iv) pass the SAR test because their readings are below the maximum SAR level 41 but they fail the MSI test because they are below the minimum SAR level 42.

The positioning of the probe array 30 in the phantom 20 is best shown by FIG. 4(a), wherein a liquid tissue simulating solution 22 is shown to be present at a level 25. A contact board 32 couples the probes 30 to a sliding support member 35 which allows x-y (planar) movement of the probe array. The phantom 20 shown in the drawings is referred to by the inventor as a Universal Head-arm (or "UniHead") because its flat-to-curved lower shaping, adjacent the DUT, simulates the flat surface of a wireless device user's head which is directly in-line with the device when it is held at the user's ear and also the curved extremities of the user's head extending away from that direct line. All of the materials of the phantom, the probe array and the support structure for the probe array are non-metallic and relatively transparent to RF energy (i.e. have a very low RF absorption).

As shown, the DUT 10 is positioned directly below and in close proximity to the phantom and rests on a sliding base member 38. Optionally (not shown in the drawings), a further phantom may be provided below the DUT whereby the phantom 20 positioned above the DUT is a head phantom such that it comprises head tissue simulation matter and the other, lower, phantom is hand phantom such that it comprises hand tissue simulation matter. The choice of appropriate composition for the tissue simulating solution is known by persons in the art and it is known that the solution must be calibrated using different components (including different quantities thereof), such as salt and/or sugar, to simulate the desired tissue type for the particular frequency to be tested. To date, it is common to use these liquid solutions but they have known disadvantages associated with them, including instability over the long-term and their corrosive properties, and an appropriate solid tissue simulating material may be a preferred alternative if such were to be made available. For example, the inventor has commenced an investigation of a solid ceramic material produced by Murata Electronics North America, Inc. as a potential candidate for a solid replacement of the conventional liquid solution. An advantage to be provided by a solid ceramic material, such as solid blocks which could be positioned within the UniHead, is that the probes could then be precisely and fixedly positioned in the UniHead with the tissue simulating material. Also, the longterm stability provided by such tissue simulating material would substantially reduce the need to replace the UniHead in the test chamber.

Figure 5:
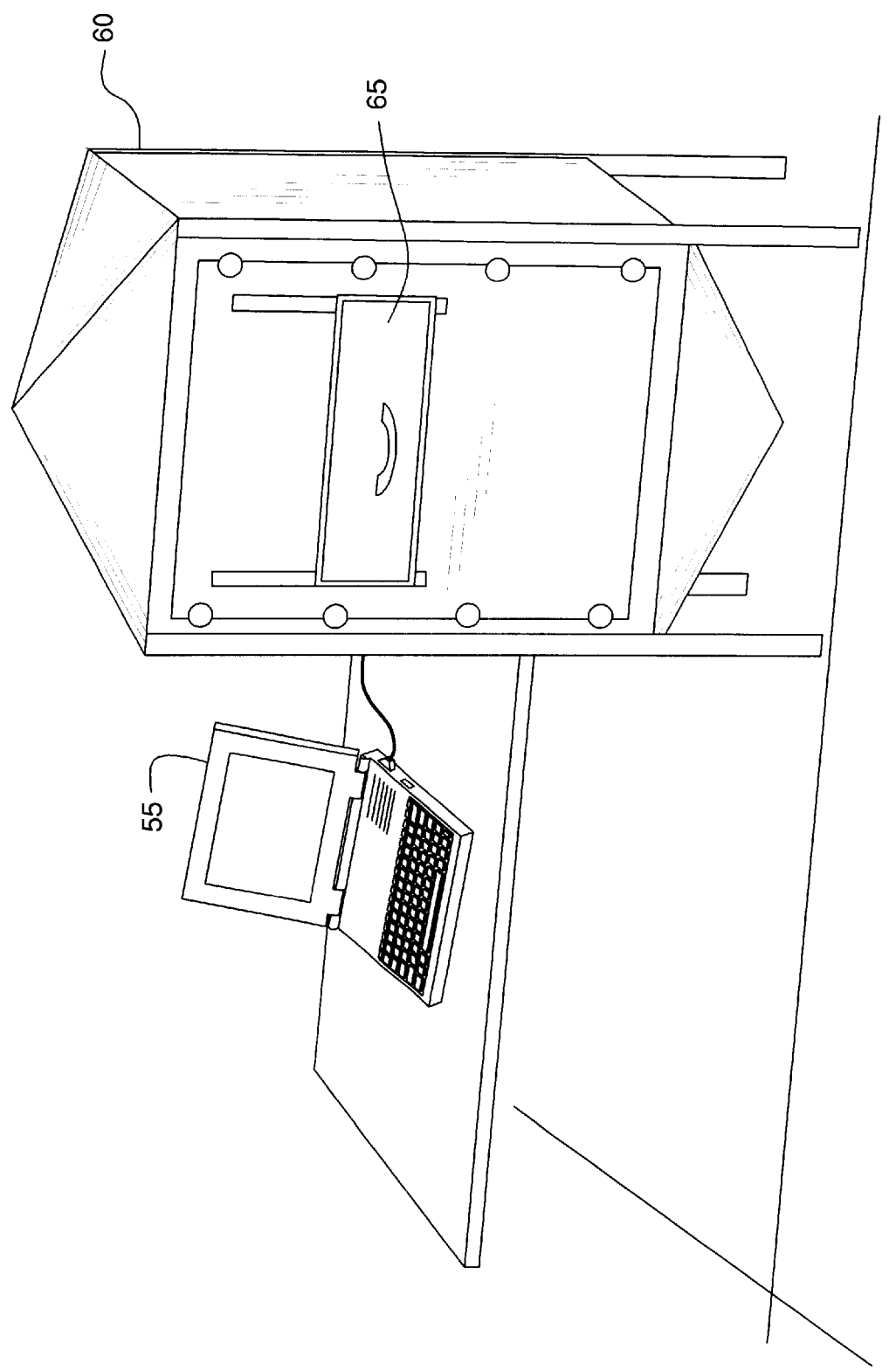
FIG. 5 is schematic diagram of a test chamber used for device testing in accordance with the invention and a computer in communication with the test measuring RF probes internal to the chamber.

FIG. 5 illustrates the RF shielded test chamber (being an enclosure) 60 of the preferred embodiment and the computer processor 55 which comprises the data acquisition system 40 and data processing system 50. The computer 55 receives the output measurements of the RF probes during the testing of a wireless device within the chamber. A door 65 of the chamber 60 is opened to slide in and out the probe support member 35 and base member 38 so that the DUT may be quickly and easily replace with another unit to be tested and the probes may be routinely inspected and repositioned. For mass production usage the movement of these sliding structures as well as the operation of the door 65 is automated.

The internal contents of the test chamber 60 are shown by FIG. 5 in which, for purposes of illustration only, the structures required for the different tests (i.e. SAR, MSI, AIBL and OERP) are shown separately as set-up 1 pertaining to SAR and MSI testing and set-up 2 pertaining to AIBL and OERP testing. However, it is intended that the combined structures, by which all four tests may be conducted simultaneously, will be provided and this preferred structure is shown by the set-up 3 drawing of FIG. 3. While it is possible to use only one of the illustrated set-ups 1 and 2, such that the testing is restricted to only, say, the SAR/MSI tests or only the AIBL (or AIBL/OERP) tests, it is preferred to provide full testing, by applying all four of the foregoing tests, according to set-up 3.

Figure 6:
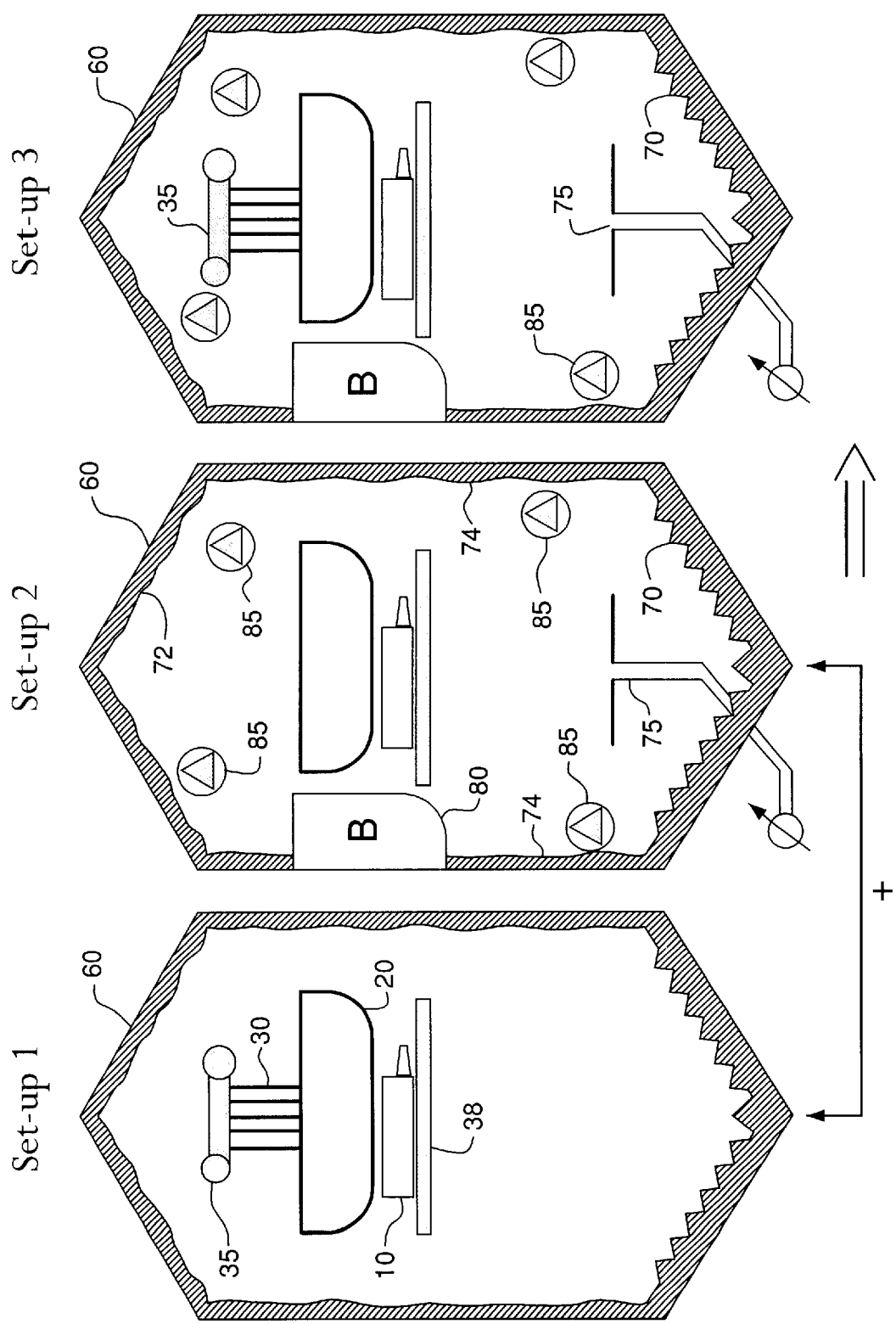
FIG. 6 is a series of schematic diagrams illustrating, as "Set-up 1", the Specific Absorption Rate (SAR)/Metallic System Integrity (MSI) testing components within the test chamber, as "Set-up 2", the Average Integrated Body Loss (AIBL) and Operating Effective Radiated Power (OERP) testing components within the chamber and, as "Set-up 3" the combination of the foregoing components within the chamber; and, FIG. 7 illustrates a sample computer screen display of test results obtained during the testing of a device in accordance with the invention.

As shown by the drawings of FIG. 6 RF absorption cones 70 comprised of RF absorbing material (which may be a carbon saturated foam, for example), are strategically distributed in the lower portion of chamber 60 to prevent reflections of the anticipated main radiation lobe(s) transmitted from the DUT while testing for Operating Effective Radiated Power (OERP). The probe 75 is positioned to be at the maximum point of radiation of the main lobe and, in cases where the DUT operates at two frequencies, an alternative preferred configuration would use two probes 75 one positioned for the maximum radiation lobe of one frequency and the other positioned for the other maximum radiation lobe. For the SAR/MSI testing, which is illustrated by the "Set-up 1" drawing, only the Universal Head structure is required and the measurements taken by the probes 30 are input to the Data Acquisition System 40 of the computer processor 55 which processes the data by comparing the probe measurements to the SAR Signature map as described above.

The "Set-up 2" drawing of FIG. 6 shows the components used to test the DUT for Average Integrated Body Loss (AIBL) and Operating Effective Radiated Power (OERP). For these tests a simulated body part 80 (i.e. a shoulder) is preferably added to the chamber adjacent the phantom 20 to better simulate the radiation environment for the DUT and the metallic ceiling 72 and side walls of the chamber provide a reflective surface, as required, for purposes of testing AIBL. Multiple RF Probes 85 (which are the same as probe 75 used to measure the effective radiated power (OERP), are preferably isotropic probes) are positioned around the DUT within the chamber to measure, at these points, the total radiated power comprising reflected and direct radiation components. These values are combined through an averaging calculation to determine the Average Integrated Body Loss (AIBL) representing the loss of power in directions departing from the main radiation lobe. Previously, AIBL testing has been limited to laboratory test environments using many evenly distributed test points and/or probes but the inventor has discovered that a few number of test points and/or probes, for testing AIBL, may be successfully used in the enclosed environment of test chamber 60 by integrating randomized signals from multiple reflecting surfaces within the enclosure 60 (e.g. top surfaces 72 and side surfaces 74).

The probe 75 positioned directly below the DUT measures the power at the point of the maximum radiation of the main radiation lobe for the DUT and this is referred to herein as the Operating Effective Radiated Power (OERP). The "Set-up 3" of FIG. 6 shows the complete test chamber 60 which combines the components of "Set-up 1" and "Set-up 2", the four tests performed by these components, SAR, MSI, AIBL and OERP being done simultaneously.

The foregoing testing, for any given DUT, is completed rapidly as a one-step process and can readily be done as one step of a wireless device production process i.e. in-line with the device production line.

The results of the foregoing testing and computer processing are displayed on the screen of the computer 55 and a sample screen display, for a DUT pass test result, is illustrated by FIG. 7. An automated and manual mode of operation are provided, the latter using the display in combination with a curser control device (e.g. mouse) to receive input from the user such as to define the test device or initiate testing. The reference for the DUT is selected conveniently by means of a pull-down menu as shown on the right-side panel of the illustrated sample. In this sample the type of wireless device being tested is a "PTO" and the Signature and reference specifications for this type of device have been assigned number "PTO 12345". Statistical data of the test results is maintained by the computer system and may be accessed for analysis at any time. A sample statistical summary is shown on the left-side panel of the display of FIG. 7.

While the invention has been described herein with reference to a multi-type testing system it is not the intention of the applicant to limit the invention thereto. Rather, it will be apparent to the reader that the invention to may be applied to a single-type test system for measuring either of SAR and AIBL alone, without departing from the scope of the invention. Further, is to be understood that the specific system components described herein are not intended to limit the invention which, from the teachings provided herein, could be implemented using a number of alternative computer program systems by persons skilled in the art. Rather the invention is defined by the appended claims.

What is claimed is:

1. A radio frequency (RF) testing apparatus for rapid testing of a wireless communications device for operational adherence of said device to a pre-determined reference specification defining specific absorption rate (SAR) parameters correlated to said device, said device being positioned within an RF shielded enclosure and operating at a test transmit power during said testing, said apparatus comprising:

(a) a plurality of means for measuring electric-field, said measuring means being configured for positioning at a pre-determined location within human tissue simulation matter, for taking a measurement of an electric-field at said location and for transmitting a signal corresponding to said measurement; and, (b) means for receiving said signals corresponding said measurements, for comparing said measurements to said SAR reference specification and for determining therefrom whether said device adheres to said specification.

2. A radio frequency (RF) testing apparatus according to claim 1 wherein said means for measuring electric-field is an isotropic E-field probe.

3. A radio frequency (RF) testing apparatus according to claim 2 wherein said means for receiving, said means for comparing and said means for determining are computer processing means.

4. A radio frequency (RF) testing apparatus according to claim 3 wherein said plurality of probes are arranged as a linear array.

5. A radio frequency (RF) testing apparatus according to claim 4 wherein said array comprises five said probes spaced uniformly.

6. A radio frequency (RF) testing apparatus according to claim 5 and further comprising said enclosure wherein said enclosure is of sufficiently small size to permit said apparatus to be incorporated into a production line for manufacturing wireless communication devices.

7. A radio frequency (RF) testing apparatus for rapid testing of the body loss of a wireless communications device positioned within an RF shielded enclosure having reflective surfaces therein and operating at a test transmit power during said testing, said apparatus comprising:

(a) a plurality of RF power measuring means for spatial distribution within said enclosure and for taking measurements of the RF power-received thereby; and, (b) means for combining said measurements and producing a value representing the averaged integrated body loss of said device.

8. A radio frequency (RF) testing apparatus according to claim 7 wherein said RF power measuring means is an isotropic probe.

9. A radio frequency (RF) testing apparatus according to claim 8 wherein said combining means is computer processing means.

10. A radio frequency (RF) testing apparatus according to claim 9 and further comprising said enclosure, wherein one said probe is located within said enclosure at a hot spot for said RF power.

11. A radio frequency (RF) testing apparatus according to claim 10 wherein said enclosure is of sufficiently small size to permit said apparatus to be incorporated into a production line for manufacturing wireless communication devices.

12. A radio frequency (RF) multi-testing apparatus for rapid simultaneous testing of the body loss of a wireless communications device and operational adherence of said device to a pre-determined reference specification defining specific absorption rate (SAR) parameters correlated to said device, said multi-testing device comprising:

(a) an RF shielded enclosure having reflective surfaces therein;

(b) an array of means for measuring electric-field wherein said array is configured for positioning at a predetermined location in said enclosure, each said means for measuring electric-field being configured for taking a measurement of an electric-field within human tissue simulation matter at said location and for transmitting a signal corresponding to said measurement of electricfield;

(c) a plurality of RF power measuring means for spatial distribution within said container, for taking measurements of the RF power received thereby and for transmitting signals corresponding to said RF power measurements; and, (d) means for receiving said signals corresponding to said RF power and electric-field measurements, for comparing said electric-field measurements to said SAR reference specification and for determining therefrom whether said device adheres to said specification, and for combining said RF power measurements and producing a value representing the averaged integrated body loss of said device.

13. A radio frequency (RF) multi-testing apparatus according to claim 12 wherein said means for measuring electric-field is an isotropic E-field probe and said means for measuring RF power is an isotropic probe.

14. A radio frequency (RF) multi-testing apparatus according to claim 13 wherein said means for receiving said signals, for comparing said electric-field measurements, for determining, for combining and for producing is computer processing means.

15. A radio frequency (RF) multi-testing apparatus according to claim 14 wherein said enclosure is of sufficiently small size to permit said apparatus to be incorporated into a production line for manufacturing wireless communication devices.

16. A radio frequency (RF) multi-testing apparatus according to claim 15 wherein at least one said RF power measuring means is located at a hot spot for said RF power for producing signal value representing the operating effective radiated power for said wireless communications device.

17. A method for rapid radio frequency (RF) testing of a wireless communications device in a production line environment for the manufacture of said device, said device being positioned within an RF shielded enclosure and operating at a test transmit power during said testing, and said device having a pre-determined reference specification defining specific absorption rate (SAR) parameters correlated thereto, said method comprising the steps:

(a) providing human tissue simulation matter within said enclosure;

(b) providing a plurality of means for measuring electric-field at a pre-determined location within said human tissue simulation matter, said electric-field measuring means taking measurements of an electric-field at said location and transmitting signals corresponding to said measurements;

(c) receiving said signals corresponding said measurements, comparing said measurements to said SAR reference specification and determining therefrom whether said device adheres to said specification.

18. A method for rapid radio frequency (RF) testing of a wireless communications device according to claim 17 whereby said enclosure has reflective surfaces therein, and further comprising the steps:

(a) providing a plurality of RF power measuring means whereby said RF power measuring means are spatially distributed within said enclosure, said RF power measuring means taking measurements of the RF power received thereby and transmitting signals corresponding to said RF power measurements; and, (b) combining said RF power measurements and producing a value representing the averaged integrated body loss of said device.

19. A method for rapid radio frequency (RF) testing of a wireless communications device according to claim 18 whereby said electric-field measuring means is an isotropic E-field probe and said RF power measuring means is an isotropic probe.

20. A method for rapid radio frequency (RF) testing of a wireless communications device according to claim 19 wherein said E-field probes are uniformly spaced in a linear array.

21. A method for rapid radio frequency (RF) testing of a wireless communications device according to claim 20 wherein said plurality of electric-field measuring means consists of five said E-field probes.

22. A method for rapid radio frequency (RF) testing of a wireless communications device according to claim 21 whereby computer processing means is used for determining whether said device adheres to said reference (SAR) specification and producing said value representing the averaged integrated body loss of said device.

23. A method for rapid radio frequency (RF) testing of a wireless communications device according to claim 22 whereby said determination by said computer processing means of whether said device adheres to said reference (SAR) specification also determines a measure of the metallic system integrity of the device.

* * * * *